| (12) | United States Patent | (10) Patent No.: | US 9,281,301 B2 |
|---|---|---|---|
| | Haslbeck et al. | (45) Date of Patent: | Mar. 8, 2016 |

(54) OPTOELECTRONIC DEVICE AND METHOD FOR PRODUCING OPTOELECTRONIC DEVICES

(75) Inventors: Stephan Haslbeck, Wiesent (DE);
Markus Foerste, Neubiberg (DE);
Michael Schwind, Sinzing (DE);
Martin Haushalter, Regensburg (DE);
Hubert Halbritter, Dietfurt (DE);
Frank Möllmer, Matting bei Pentling (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/118,367

(22) PCT Filed: May 19, 2011

(86) PCT No.: PCT/EP2011/058186
§ 371 (c)(1),
(2), (4) Date: Feb. 19, 2014

(87) PCT Pub. No.: WO2012/155984
PCT Pub. Date: Nov. 22, 2012

(65) Prior Publication Data
US 2014/0191253 A1 Jul. 10, 2014

(51) Int. Cl.
*H01L 33/48* (2010.01)
*H01L 25/16* (2006.01)
(Continued)

(52) U.S. Cl.
CPC .......... *H01L 25/167* (2013.01); *H01L 31/0203* (2013.01); *H01L 31/0232* (2013.01); *H01L 31/02162* (2013.01); *H01L 31/167* (2013.01); *H01L 33/483* (2013.01); *H01L 33/58* (2013.01); *H01L 33/60* (2013.01);
(Continued)

(58) Field of Classification Search
USPC ........................... 438/24, 27; 257/88, 98, 704
IPC ......................................................... H01L 33/60
See application file for complete search history.

(56) References Cited

U.S. PATENT DOCUMENTS 5,340,993 A * 8/1994 Salina et al. .................. 250/551
6,621,161 B2 * 9/2003 Miyawaki ..................... 257/723
(Continued)

FOREIGN PATENT DOCUMENTS

DE 10 2006 060 408 A1 6/2008
EP 1 494 277 A2 1/2005
(Continued)

OTHER PUBLICATIONS

English translation of Japanese Notification of Reasons for Refusal dispatched Sep. 1, 2014 from corresponding Japanese Patent Application No. 2014-510671.

(Continued)

*Primary Examiner* — Eugene Lee
(74) *Attorney, Agent, or Firm* — DLA Piper LLP (US)

(57) ABSTRACT

An optoelectronic device includes an optoelectronic component that receives or generates radiation, a frame having a cavity, the optoelectronic component being arranged in said cavity, a connection carrier to which the optoelectronic component is fixed, and a cover covering the cavity and forming a radiation passage area for the radiation, wherein a beam path from the optoelectronic component to the radiation passage area is free of an encapsulation material for the optoelectronic component.

16 Claims, 8 Drawing Sheets

(51) Int. Cl.
  *H01L 31/0203* (2014.01)
  *H01L 31/0216* (2014.01)
  *H01L 31/0232* (2014.01)
  *H01L 31/167* (2006.01)
  *H01L 33/58* (2010.01)
  *H01L 33/60* (2010.01)
  *H01L 25/075* (2006.01)
  *H01L 33/62* (2010.01)

(52) U.S. Cl.
  CPC ......... *H01L 25/0753* (2013.01); *H01L 33/486* (2013.01); *H01L 33/62* (2013.01); *H01L 2224/48227* (2013.01)

(56) References Cited

U.S. PATENT DOCUMENTS

| | | | | |
|---|---|---|---|---|
| 7,282,788 | B2* | 10/2007 | Chen | 257/680 |
| 7,489,031 | B2* | 2/2009 | Roberts et al. | 257/687 |
| 7,718,456 | B2* | 5/2010 | Maeda et al. | 438/40 |
| 7,851,812 | B2 | 12/2010 | Behringer et al. | |
| 7,982,226 | B2* | 7/2011 | Lee et al. | 257/80 |
| 8,513,691 | B2* | 8/2013 | De Graaf et al. | 257/98 |
| 8,680,636 | B2* | 3/2014 | Yajima et al. | 257/434 |
| 8,887,384 | B2* | 11/2014 | Kasper | 29/846 |
| 2004/0038442 | A1 | 2/2004 | Kinsman | |
| 2005/0001219 | A1* | 1/2005 | Minamio et al. | 257/79 |
| 2005/0275079 | A1 | 12/2005 | Stark | |
| 2006/0147746 | A1* | 7/2006 | Wakako et al. | 428/627 |
| 2006/0244118 | A1 | 11/2006 | Roberts et al. | |
| 2007/0057356 | A1 | 3/2007 | Chen | |
| 2007/0200130 | A1 | 8/2007 | Behringer et al. | |
| 2007/0284714 | A1 | 12/2007 | Sakakibara et al. | |
| 2008/0217709 | A1* | 9/2008 | Minervini et al. | 257/416 |
| 2011/0062470 | A1* | 3/2011 | Bierhuizen et al. | 257/98 |

FOREIGN PATENT DOCUMENTS

| | | |
|---|---|---|
| EP | 1 826 832 A2 | 8/2007 |
| JP | 1-133752 | 12/1989 |
| JP | 4-340771 | 11/1992 |
| JP | 5-283549 | 10/1993 |
| JP | 2003-152123 | 5/2003 |
| JP | 2003-218398 | 7/2003 |
| JP | 2003-347601 | 12/2003 |
| JP | 2006-222358 | 8/2006 |
| JP | 2006-278743 | 10/2006 |
| JP | 2007-227935 | 9/2007 |
| JP | 2007-234977 | 9/2007 |
| JP | 2008-21987 | 1/2008 |
| JP | 2009-123921 | 6/2009 |
| JP | 2010-258237 | 11/2010 |
| WO | 2008/023827 | 2/2008 |
| WO | 2012/139662 A1 | 10/2012 |

OTHER PUBLICATIONS

English translation of Chinese Notification of the First Office Action and Search Report dated May 29, 2015 from corresponding Chinese Patent Application No. 201180070971.8.

English translation of the Notification of Reasons for Refusal dated Aug. 3, 2015 of corresponding Japanese Application No. 2014-510671.

* cited by examiner

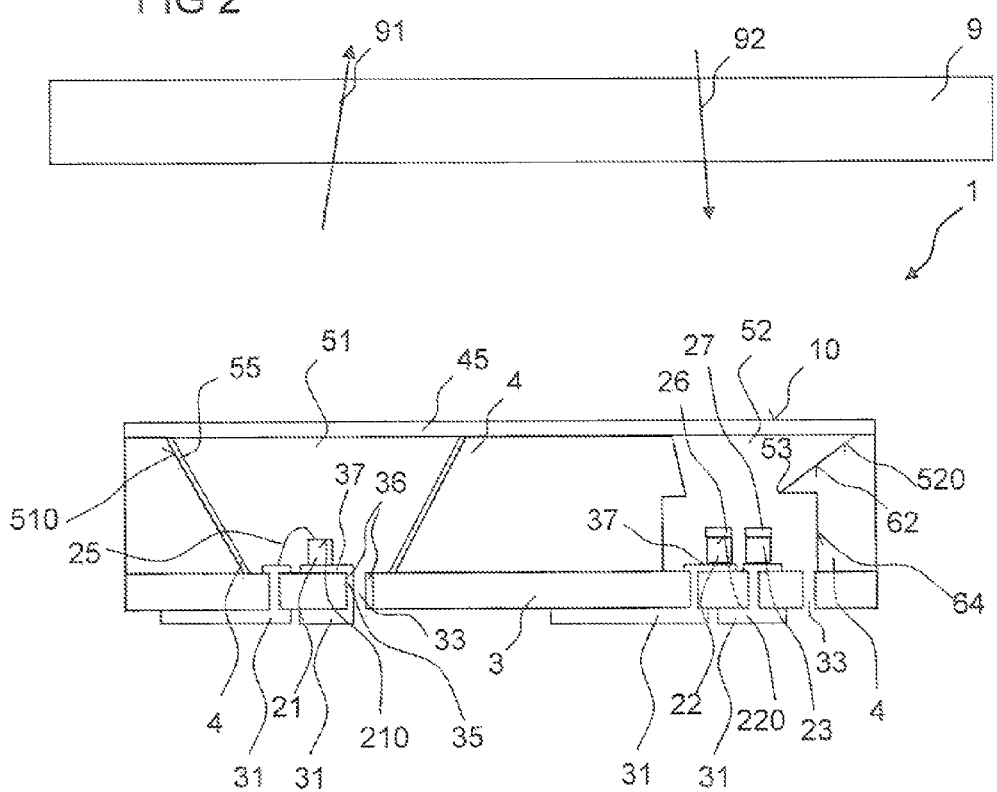

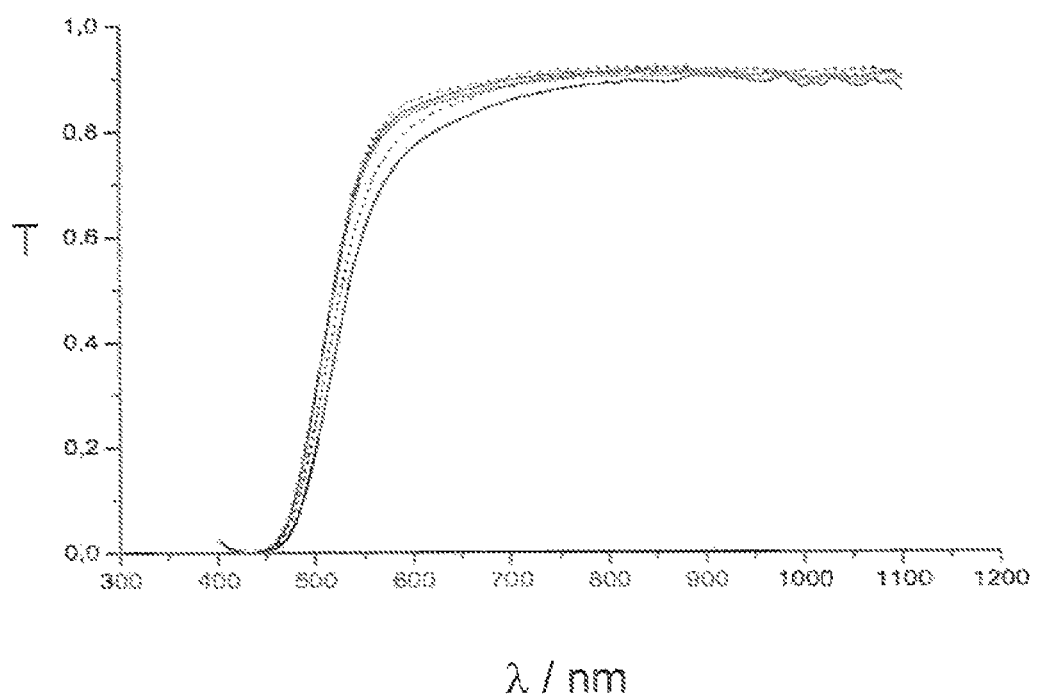

OPTOELECTRONIC DEVICE AND METHOD FOR PRODUCING OPTOELECTRONIC DEVICES

TECHNICAL FIELD

This disclosure relates to an optoelectronic device comprising at least one optoelectronic component, and to a method of producing optoelectronic devices.

BACKGROUND

In optoelectronic devices, different coefficients of thermal expansion of the individual elements such as, for example, a semiconductor chip, encapsulation of the semiconductor chip and housing, can cause a high mechanical loading of individual elements or regions of the device. This effect may be intensified further with increasing miniaturization of the design.

There is, therefore, a need to provide an optoelectronic device is particularly compact and which is distinguished by good optoelectronic properties over a long operating life. Furthermore, there is a need to provide a method by which optoelectronic devices can be reliably produced in a simplified manner.

SUMMARY

We provide an optoelectronic device including an optoelectronic component that receives or generates radiation, a frame having a cavity, the optoelectronic component being arranged in said cavity, a connection carrier to which the optoelectronic component is fixed, and a cover covering the cavity and forming a radiation passage area for the radiation, wherein a beam path from the optoelectronic component to the radiation passage area is free of an encapsulation material for the optoelectronic component.

We also provide a method of producing a plurality of optoelectronic devices including a) providing a connection carrier assemblage; b) arranging optoelectronic components on the connection carrier assemblage; c) positioning a frame element having a plurality of cavities on the connection carrier assemblage such that the optoelectronic components are respectively arranged in a cavity; d) arranging a cover on the frame element; and e) severing the connection carrier assemblage into a plurality of connection carriers, on each of which at least one optoelectronic component and a frame having a cavity are arranged.

We further provide an optoelectronic device including an optoelectronic component that receives or generates radiation, a frame having a cavity, the optoelectronic component arranged in said cavity, a connection carrier to which the optoelectronic component is fixed, wherein the connection carrier is a circuit board and has a plated through hole through the connection carrier, the plated through hole being an opening for an air exchange between the cavity and the environment; and a cover covering the cavity and forming a radiation passage area for the radiation, wherein a beam path from the optoelectronic component to the radiation passage area is free of an encapsulation material for the optoelectronic component.

BRIEF DESCRIPTION OF DRAWINGS

FIG. 2 shows a second example of an optoelectronic device in schematic sectional view.

FIG. 3 shows curves for the transmission T of examples of the cover as a function of the wavelength $\lambda$.

DETAILED DESCRIPTION

Figure 1:
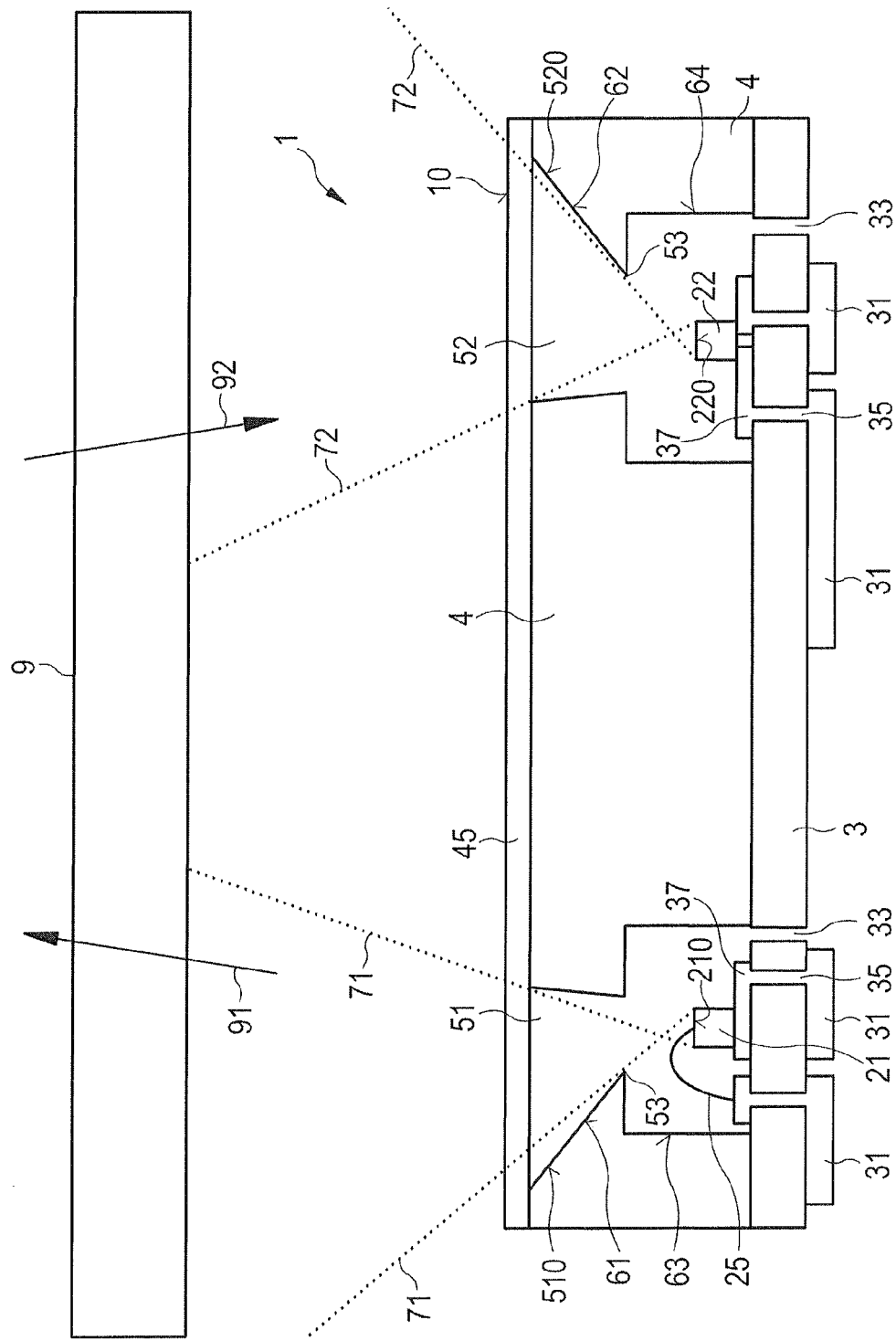
FIG. 1 shows a first example of an optoelectronic device in schematic sectional view.

Our optoelectronic device may comprise an optoelectronic component that receives and/or generates radiation. The optoelectronic device can comprise, in particular, a further optoelectronic component. The further optoelectronic component together with the optoelectronic component can form an emitter-detector pair. The optoelectronic component and/or, if appropriate, the further optoelectronic component can be, in particular, an unpackaged semiconductor chip. That is to say that the optoelectronic component itself is free of a housing in which the semiconductor chip is arranged. A compact configuration of the device is thus simplified.

The optoelectronic device may comprise a connection carrier to which the optoelectronic component and, if appropriate, the further optoelectronic component is fixed. In particular, an optoelectronic component can in each case be electrically conductively connected to at least two connection areas of the connection carrier. The connection carrier can be, for example, a circuit board, for instance a printed circuit board (PCB) or as a metal-core circuit board. The connection carrier can terminate the optoelectronic device on the rear side, that is to say on a side situated opposite a radiation passage area of the optoelectronic device. As an alternative to a circuit board, the connection carrier can be, for example, a leadframe.

The optoelectronic device may be a surface mounted device (smd). The connection carrier, for instance the circuit board, may be part of the optoelectronic device which can be arranged for mounting, for example, on a further circuit board and can be electrically conductively connected thereto.

The connection carrier may have contact areas for the external electrical contact-making on the side facing away from the radiation passage area. The contact areas can be electrically connected to the optoelectronic component and, if appropriate, the further optoelectronic component via plated-through holes through the connection carrier. Therefore, electrical contact can be made with the optoelectronic device externally from the rear side.

The optoelectronic device may have a frame. The frame can have a cavity, the optoelectronic component being arranged in the cavity. The cavity can extend along a direction completely through the frame. The frame can be arranged on the connection carrier and furthermore fixed thereto, for example, by a fixing layer. In particular, the cavity can completely extend around the optoelectronic component in a lateral direction.

The optoelectronic device may have a cover. The cover covers the cavity of the frame in particular completely and forms a radiation passage area for the radiation to be received or to be generated by the optoelectronic component. The cover is therefore situated in the beam path of the optoelectronic component.

The cover may be a film. The film can contain a polyimide or consist of a polyimide.

In this case, a polyimide denotes, in particular, a polymer comprising imide groups as essential structural units of the main chain of the polymer, wherein the imide groups can be present as linear or cyclic units. Furthermore, alongside the imide groups, the polymer can also comprise further functional groups as constituents of the main chain of the polymer, for example, amide, ester and/or ether groups.

Polyimides can be distinguished by a high stability and strength in a wide temperature range. The film is preferably designed to be highly temperature-resistant. That is to say that the film withstands temperature loads of at least 200° C., particularly preferably of at least 250° C. By virtue of the high temperature resistance and heat distortion resistance, a film comprising a polyimide, for example, within the production process or the further processing of the optoelectronic device, can be exposed to temperatures such as can usually occur during soldering methods.

The connection carrier may be arranged on that side of the frame facing from the cover. In a vertical direction, the optoelectronic device therefore extends between the connection carrier and the cover.

A beam path from the optoelectronic component to the radiation passage area may be free of an encapsulation material for the optoelectronic component. In other words, the cavity of the frame is not filled with an encapsulation that partly or completely encapsulates the optoelectronic component, for instance a silicone or an epoxy. The optical properties of the device are thus improved. Furthermore, it is thus possible to avoid the risk of mechanical loading of the optoelectronic component or of a connecting conductor, for example, of a bonding wire between the optoelectronic component and the connection carrier, on account of different degrees of thermal expansion of the frame and of the encapsulation material. The risk of a premature failure of the device can thus be reduced. The protection of the optoelectronic component against environmental influences such as dust is obtained by the cover.

The cavity may have an undercut region in a direction running from the cover to the optoelectronic element. The undercut region is expediently arranged such that it can receive the optoelectronic component.

The cavity may have a region that tapers at least regionally from the cover in the direction of the optoelectronic component. The cavity can therefore have a reflector-like basic form at least regionally. The cavity can be reflective at least regionally. By way of example, the cavity can be provided with a coating that directionally or diffusely reflects radiation emitted and/or to be emitted by the optoelectronic component. The frame can be formed by a material having a high reflectivity, preferably a reflectivity of at least 80%, for the radiation. By way of example, the frame can be formed from a plastic filled with reflective particles, for instance titanium oxide particles. With a reflective configuration in the cavity, the radiation emitted overall through the radiation passage area or the proportion of the radiation that passes through the radiation passage area and is detected by the optoelectronic component may be increased.

Alternatively or supplementary, the frame, in particular the cavity, can have a region that is absorbent in a targeted manner for the radiation. In particular, at least 50% of the impinging radiation, preferably at least 80% of the impinging radiation, can be absorbed in the region. The frame can be black to the human eye, for example. The proportion of stray radiation deflected at the frame, in particular at the cavity, is thus reduced.

The frame and the connection carrier, preferably the frame, the connection carrier and the cover, may terminate flush at least along one direction. Such a device can be produced in a simplified manner in the assemblage, wherein during singulation, the frame, the connection carrier and the cover emerge from the assemblage by severing in particular in a common manufacturing step.

The optoelectronic device may have an opening for an air exchange between the cavity and the environment. The cavity is therefore not hermetically sealed. The risk of an action of force on the cover due to a reduced or excess pressure in the cavity in the event of changes in the temperature of the optoelectronic device, for example, during the mounting of the device by soldering, is thus eliminated or at least reduced. In particular, the connection carrier, for instance a circuit board connection carrier can have the opening. In particular, a plated-through hole through the connection carrier can be the opening.

The further optoelectronic component may be arranged in a further cavity and the further cavity is spaced apart from the cavity. At least two optoelectronic components of the optoelectronic device can therefore be arranged in mutually separate cavities. In particular, an emitter can be arranged in the cavity and a detector can be arranged in the further cavity, or vice versa. However, more than one optoelectronic component can also be arranged in a cavity. By way of example, two detectors can be arranged in a cavity, which detectors can be provided, for example, for the detection of radiation in mutually different spectral ranges.

A direct beam path between the optoelectronic component and the further optoelectronic component is suppressed by the frame. Even in the case of a comparatively small distance between the optoelectronic components, an undesired signal portion on account of an optical crosstalk is avoided or at least reduced by means of the frame.

The optoelectronic device may be a proximity sensor and/or an ambient light sensor. In particular, the optoelectronic device can comprise an additional optoelectronic component in addition to the emitter-detector pair formed by the optoelectronic component and the further optoelectronic component. In this case, the emitter-detector pair can form the proximity sensor and the additional optoelectronic component can form the ambient light sensor. The detector of the proximity sensor and the additional optoelectronic component can be arranged in a common cavity.

The optoelectronic device may comprise:

an optoelectronic component that receives or generates radiation, a frame having a cavity, the optoelectronic component being arranged in said cavity, a connection earner to which the optoelectronic component is fixed, and a cover which covers the cavity and which forms a radiation passage area for the radiation, wherein a beam path from the optoelectronic component to the radiation passage area is free of an encapsulation material for the optoelectronic component.

In our methods of producing a plurality of optoelectronic devices a connection carrier assemblage may be provided. Optoelectronic components are arranged on the connection carrier assemblage. A frame element having a plurality of cavities is positioned on the connection carrier assemblage such that the optoelectronic components are respectively arranged in a cavity. A cover is arranged on the frame element. The connection carrier assemblage is severed into a plurality of connection carriers, on each of which at least one optoelectronic component and a frame having a cavity are arranged. In particular, during severing of the cover, the frame element and the connection carrier assemblage can be severed in a common production step. This can be effected, for example, mechanically, for instance by sawing or a laser separating method.

The method described is particularly suitable for producing an optoelectronic device described further above. Therefore, features explained in connection with the optoelectronic device: can also be used for the method, and vice versa.

In particular, the method can be used to realize an optical device comprising an emitter-detector pair in which the emitter and the detector are optically separated from one another by the frame that already emerges from the frame element during singulation. Additional elements to be placed subsequently onto the device for optical separation can be dispensed with. As a result, it is possible to avoid an extra outlay on costs while at the same time improving the optoelectronic properties.

Further features, configurations and expediencies will become apparent from the following description of the examples in conjunction with the figures.

Elements that are identical, of identical type or act identically are provided with the same reference signs in the figures.

The figures and the size relationships of the elements illustrated in the figures among one another should not be regarded as to scale. Moreover, individual elements may be illustrated with an exaggerated size to enable better illustration and/or afford a better understanding.

FIG. 1 schematically illustrates a first example of an optoelectronic device in sectional view. In this example, the optoelectronic device 1 is a proximity sensor in which an optoelectronic component 21 and a further optoelectronic component 22 form an emitter-detector pair.

The optoelectronic device 1 comprises a connection carrier 3 to which the optoelectronic components 21, 22 are fixed. Contact areas 31 are formed on a rear side of the connection carrier 3 facing away from the optoelectronic components, the contact areas provided to make electrical contact with the optoelectronic device externally. The contact areas 31 connect to connection areas 37 via plated-through holes 35 extending through the connection carrier 3, the connection areas in turn electrically conductively connecting to the optoelectronic components 21, 22. The plated-through holes can be cutouts in the connection carrier, the side areas of which cutouts are coated electrically conductively, preferably metallically. The coated cutouts can be filled with a filling material, for instance a soldering resist.

At least one of the optoelectronic components 21, 22 is preferably an unpackaged optoelectronic semiconductor chip. The optoelectronic component which is an emitter can be a luminescence diode, in particular as a light emitting diode. The further optoelectronic component which is a detector can be, for example, a photodiode or a phototransistor. Alternatively, an integrated circuit having a photosensitive region, for instance an ASIC (application specific integrated circuit), can also be employed. Electrical contact can be made with the semiconductor chip, for example, by a connecting conductor 25, for instance a bonding wire.

A frame 4 is arranged on the connection carrier 3 and mechanically stably connected thereto, for example, by a fixing layer, for instance an adhesive layer (not explicitly illustrated).

The frame 4 has a cavity 51 and a further cavity 52, wherein the optoelectronic component 21 is arranged in the cavity 51 and the further optoelectronic component 22 is arranged in the further cavity 52. The cavity 51 forms an aperture which defines a radiation cone, represented by a dotted line 71, for the radiation emerging from a main radiation passage area 210 of the optoelectronic component 21. The further cavity 52 correspondingly forms a further aperture defining a further radiation cone 72. Radiation passing within this further radiation cone to the optoelectronic device impinges directly on a further main radiation passage area 220 of the further optoelectronic component 22.

An inner area 510 of the cavity 51 has an inclined region 61 and an undercut region 63. The undercut region 63 is arranged nearer to the optoelectronic component 21. In the undercut region, the cavity 51 is at least large enough that this region can accommodate the optoelectronic component 21.

In the inclined region 61, the cavity 51 tapers toward the optoelectronic component 21. A boundary 53 terminating the inclined region 61 on the part of the optoelectronic component 21 regionally forms the aperture defining the radiation cone 71. While the minimum lateral extent of the undercut region 63 of the cavity 51 is predefined by the size of the optoelectronic component to be accommodated, the aperture can be set largely independently thereof by the boundary 53, in particular to a smaller cross section in a plan view of the device 1.

Analogously thereto, the further cavity 52 has a further inner area 520 having a further inclined region 62 and a further undercut region 64.

During operation of the optoelectronic device 1, the first optoelectronic component 21 emits radiation through a window 9, represented by an arrow 91. Part of this emitted radiation is reflected back, as illustrated by an arrow 92, and impinges on the further optoelectronic component 22.

The radiation cones 71, 72 and the distance between the window 9 and the optoelectronic device 1 are preferably adapted to one another such that the radiation cones 71, 72 do not overlap in the region of the window 9. It is thus possible to avoid to the greatest possible extent the situation in which radiation which does not emerge from the window 9, but rather impinges as reflected stray radiation on the further component 22, causes a disturbing signal portion. In other words, the optical crosstalk within the optoelectronic device between the component 21 and the further component 22 is suppressed.

A cover 45 is arranged on the top side of the frame 4 facing away from the connection carrier 3, the cover covering the cavities 51, 52. The cover forms a radiation passage area 10 for the optoelectronic device 1. The cover is provided to protect the optoelectronic components 21, 22 and, if appropriate, the connecting conductors 25. An additional encapsulation of the optoelectronic component which at least partly fills the cavities 51, 52 and directly adjoins the optoelectronic components 21, 22 is therefore not necessary. In particular, a beam path from the main radiation passage area 210 to the cover 45 is free of such an encapsulation material. The radiation emitted or detected during operation passes through a free-radiating region between the cover 45 and the main radiation passage area 210 or the further main radiation passage area 220, respectively.

The risk of a high mechanical loading of the optoelectronic components 21, 22 and/or of the connecting conductors 25 on account of coefficients of thermal expansion of different magnitudes of the encapsulation material, in particular directly adjoining the connecting conductor 25, and of the frame 4 can thus be avoided.

The connection carrier 3 and the frame 4 and preferably also the film terminate flush in a lateral direction. A device of this type can be produced in a simplified manner in the assemblage.

The cover 45 is preferably a film, in particular a film containing a polyimide. In particular, the polyimide can contain a poly-(diphenyl oxide pyromellitimide) or consist of such a material. A high-temperature-resistant cover and, hence, a solderable optoelectronic device 1 is thus realized in a simple manner. Such a film is sold, for example, by DuPont de Nemours under the trademark KAPTON.

The cover 45, in particular the film expediently has a transmission of at least 70%, preferably of at least 80%, particularly preferably of at least 90%, for the radiation emitted and/or to be detected during operation. A wavelength range for the radiation emitted and/or to be detected during operation is preferably 700 nm to 1100 nm, particularly preferably 800 nm to 1000 nm. By way of example, a peak wavelength of the emitted radiation can be 850 nm or 940 nm, in each case with a deviation of +/−50 nm.

As illustrated in FIG. 3, polyimide films can have a transmission of approximately 90% in the wavelength range of approximately 700 nm to 1100 nm. The decrease in transmission toward shorter wavelengths corresponds approximately to the sensitivity curve of the human eye in bright light, which at approximately 515 nm decreases to half the value relative to the maximum value at approximately 560 nm. A polyimide film is therefore also suitable to define the short-wave edge of a daylight sensor.

As an alternative to a film, a self-supporting lamina, for example, a plastic lamina or a glass lamina, can also be employed for the cover 45.

With the choice of material for the cover 45 and/or by the form of the cover, for instance the thickness of the cover and/or by a structuring, for example by an embossing, transmission of the cover can be adapted to the respective requirements.

The connection carrier 3 has openings 33 via which air can be exchanged between the environment and the cavity 51 and, respectively, the further cavity 52. The risk that an excessively high mechanical loading of the cover 45 will arise as a result of the formation of a reduced or excess pressure in at least one of the cavities 51, 52 relative to the environment, for example, in the event of a temperature change, for instance dining the mounting of the optoelectronic device by soldering, is thus largely reduced. The openings 33 can be formed analogously to the plated-through holes 35 by cutouts in the connection carrier 3, wherein the openings 33, in contrast to the plated-through holes, are not or at least not completely filled.

In a departure from the example described, the connection carrier can also be a leadframe to which the optoelectronic components 21, 22 are electrically conductively connected. Furthermore, the optoelectronic device can also comprise only one optoelectronic component or more than two optoelectronic components.

The optoelectronic device 1 described can be produced particularly compactly and cost-effectively and is therefore suitable for many applications. The optoelectronic device is suitable in particular as a proximity sensor and/or ambient light sensor in electronic appliances, for example, in handheld appliances, for instance in cellular phones.

The second example, illustrated in schematic sectional view in FIG. 2, substantially corresponds to the first example described in connection with FIG. 1. In contrast thereto, the cavity 51 is in a reflector-like basic form. Even radiation emerging at a comparatively large angle through the main radiation passage area 210 and/or through a side area of the optoelectronic component 21 can thus emerge from the radiation passage area 10 of the device 1. Furthermore, the inner area 510 of the cavity 51 is provided with a coating. In this example, the cavity is reflective by means of the coating 55, for the radiation emitted by the optoelectronic component 21. The coating can have a reflectivity of 60% or more, preferably of 80% or more. By way of example, a metal, for instance, aluminum, silver, rhodium, palladium, chromium or nickel, or a metallic alloy comprising at least one of the materials mentioned is suitable for the coating. The radiation power emitted overall by the optoelectronic device can thus be increased. As an alternative to a coating, the frame 4 itself can be produced from a reflective material. By way of example, the frame can contain a plastic filled with reflective particles, for example, titanium oxide particles.

In a departure from the example described, as an alternative or in addition to the cavity 51, the further cavity 52 can also be provided with such a coating. Furthermore, the frame 4 can also be produced from a reflective material and the coating can be provided for adsorption in a targeted manner radiation in the spectral range to be detected. By way of example, the frame 4 or the coating 55 can absorb at least 50% of the impinging radiation.

It goes without saying that a coating as described above can also be employed in the first example described in connection with FIG. 1. By way of example, the undercut region 63 of the cavity 51 can be provided with such a coating completely or only regionally.

Furthermore, in contrast to the first example, an additional optoelectronic component 23 is arranged in the further cavity 52 and electrical contact can be made with it externally via contact areas 31. The additional optoelectronic component 23 is provided for the detection of radiation in a detection range different from the detection range of the further optoelectronic component 22. Preferably, the additional optoelectronic component is an ambient light sensor, the spectral sensitivity distribution of which is approximated to the sensitivity distribution of the human eye or corresponds thereto. The emitter-detector pair preferably operates in the spectral range in the near infrared, in particular in the wavelength range of 800 nm to 1000 nm.

The different sensitivity distributions of the further component 22 and the additional component 23 are obtained in this example by a filter 26 on the further component 22 and by a further filter 27 on the additional component 23. The further filter 27 is preferably arranged such that said further filter together with the transmission of the cover 45 simulates the sensitivity distribution of the human eye. With the use of a polyimide film, a filter that determines the long-wave edge of the sensitivity radiation suffices for this purpose. The use of a comparatively expensive filter which is a bandpass filter can therefore be dispensed with.

The further component 22 and the additional component 23 can therefore be identical, apart from the filters of different types. Alternatively or supplementarily, different sensitivity distributions can be obtained by components of different types.

In a departure from the example described with the further component 22 and the additional component 23, the further component 22 can also have two radiation-detecting regions. The functionality described in connection with the additional component 23 can thus be integrated into the further component. The further component can therefore be a detector of a proximity sensor and as an ambient light sensor.

Furthermore, in contrast to the first example, a plated-through hole 35 is an opening 33 through which air can be exchanged between the cavity 51 and the environment. The plated-through hole 35 is a cutout whose side areas are provided with an electrically conductive contact coating 36. The cutout with the contact coating is free of a filling material such that a path for an air exchange arises. Preferably, for each cavity 51, 52 at least one plated-through hole is such an opening. Openings in addition to the plated-through holes are therefore not necessary, but can additionally be provided. It is also possible for a plurality of plated-through holes per cavity, in particular also all plated-through holes to be openings. It goes without saying that plated-through holes which are openings can also be employed in the first example described in connection with FIG. 1.

Figure 4A:
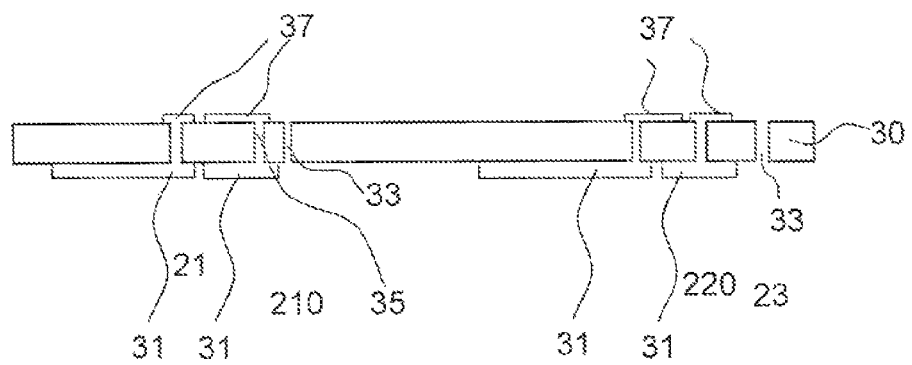
FIGS. 4A to 4E show an example of a method of producing optoelectronic devices.

An example of a method of producing an optoelectronic device is illustrated schematically in sectional view in FIGS. 4a to 4E. A connection carrier assemblage 30 from which a plurality of connection carriers emerge during production is illustrated in FIG. 4A. For the sake of simplified illustration, only a part of the connection carrier assemblage 30 is shown with which an optoelectronic device is formed during production.

The connection carrier 3, for example, a circuit board has plated-through holes 35, via which rear-side contact areas 31 are connected to front-side connection areas 37.

Furthermore, the connection carrier 3 has openings 33 extending through the connection carrier. The openings and the cutouts for the plated-through holes 35 can be formed in one common production step, wherein the openings 33, in contrast to the plated-through holes 33, are not filled with a filling material, or are at least only partly filled with a filling material.

Figure 4B:
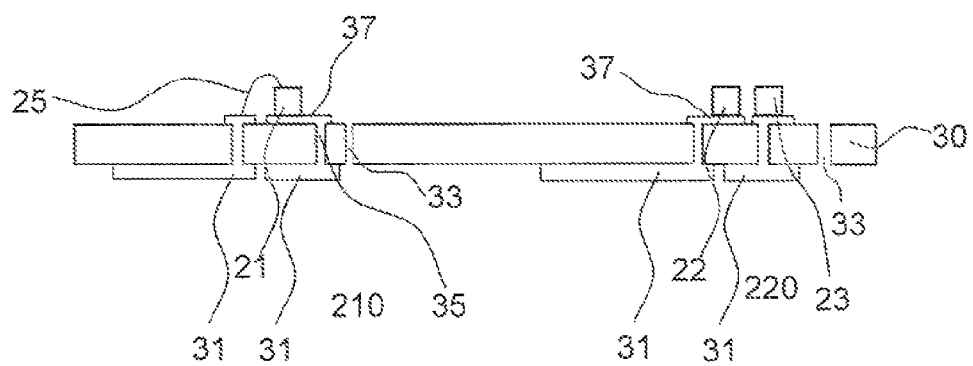
Figure 4C:
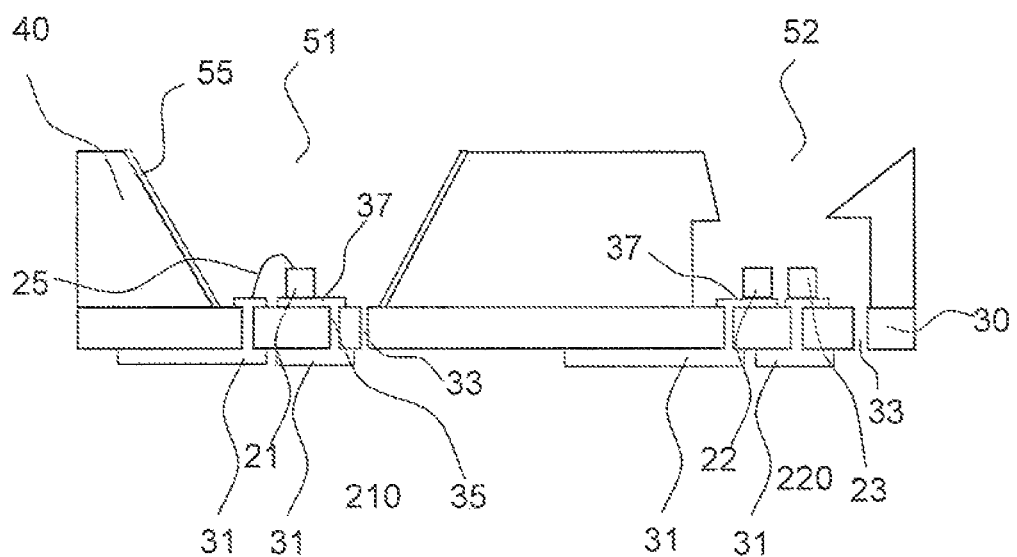

A plurality of preferably unpackaged optoelectronic components 21, 22, 23 are arranged on the connection carrier assemblage 30 and electrically contact-connected to the connection areas 37. This can be effected, for example, by a soldering connection, an electrically conductive adhesive-bonding connection (not explicitly illustrated) or by a connecting conductor 25, for instance a bonding wire (FIG. 4B).

On the connection carrier assemblage 30 with the optoelectronic components 21, 22, 23 already mounted and contact-connected, a frame element 40 having a plurality of cavities 51, 52 is positioned such that the components are arranged within the cavities. The frame 4 can be fixed to the connection carrier assemblage 30, for example, by a fixing layer, for instance an adhesive layer (not explicitly illustrated in FIG. 4C).

An optionally present coating 55 of the frame element 40 is preferably applied already before the frame element is fixed to the connection carrier 30.

A cover 45 is applied on a side of the frame element 40 facing away from the connection carrier 30, the cover covering the cavities 51, 52. By way of example, as the cover a film, in particular a polyimide film, can be extended over the cavities 51, 52.

Figure 4D:
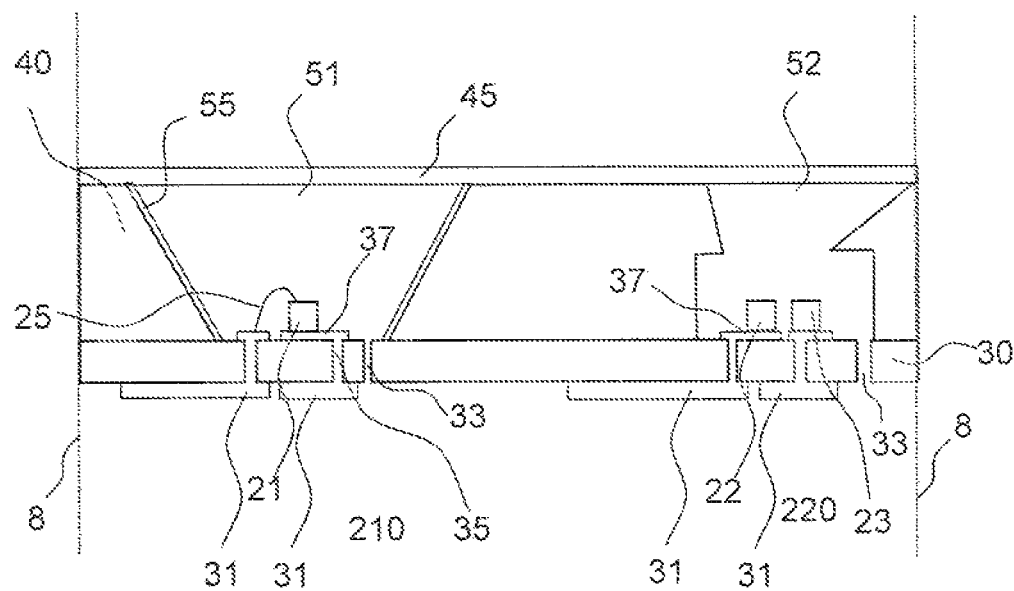

The assemblage thus formed and comprising connection carrier assemblage 30, frame element 40 and cover 45 is severed along separating lines 8, as a result of which mutually separate optoelectronic devices 1 emerge in which the frame 4, the connection carrier 3 and the cover 45 terminate, flush at least regionally. The severing can be effected in particular mechanically, for instance by sawing, or by coherent radiation, for instance by a laser separating method (FIG. 4D).

Figure 4E:
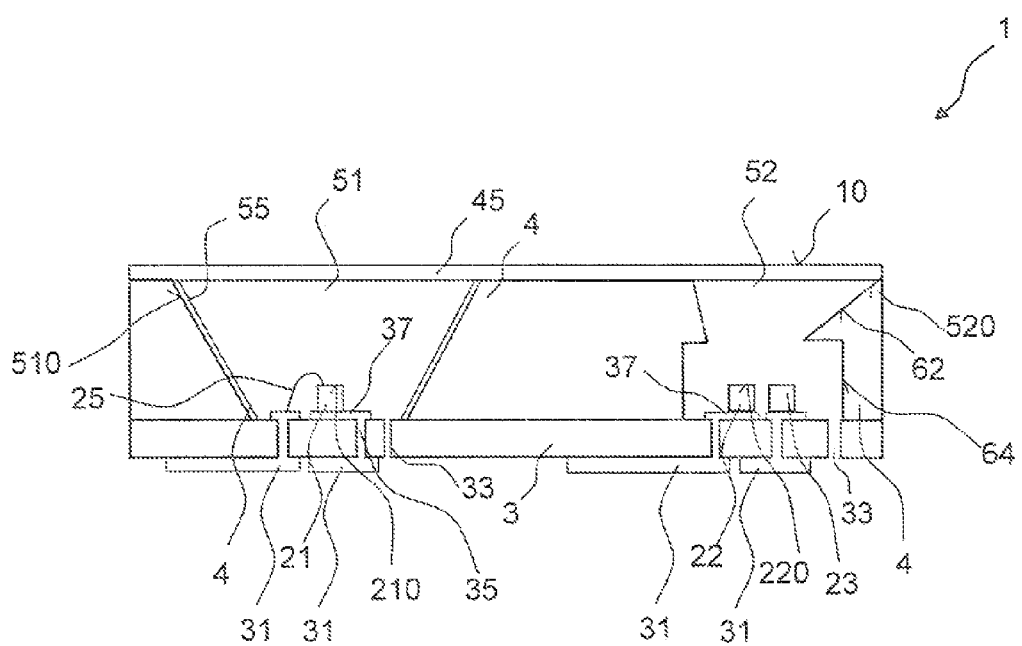

A completed optoelectronic device 1, which is substantially as described in connection with FIG. 2, is illustrated in FIG. 4E.

The method described makes it possible to produce optoelectronic devices in the assemblage in a simple and reliable manner, wherein surface-mounted optoelectronic devices ready for further mounting emerge upon the singulation of the assemblage.

With the cover 45, the optoelectronic components 21, 22, 23 are already protected during singulation into optoelectronic devices 1. An additional encapsulation material such as a potting compound to protect the optoelectronic components is not necessary.

Our devices and methods are not restricted by the description on the basis of the examples. Rather, the disclosure encompasses any novel feature and also any combination of features, which in particular includes any combination of features in the appended claims, even if the feature or combination itself is not explicitly specified in the claims or the examples.

The invention claimed is:

1. An optoelectronic device comprising:
   an optoelectronic component that receives or generates radiation;
   a frame having a cavity, the optoelectronic component arranged in said cavity;
   a connection carrier to which the optoelectronic component is fixed, wherein the connection carrier is a circuit board and has a plated through hole through the connection carrier, the plated through hole being an opening for an air exchange between the cavity and the environment;
   a cover covering the cavity and forming a radiation passage area for the radiation, wherein a beam path from the optoelectronic component to the radiation passage area is free of an encapsulation material for the optoelectronic component,
   an ambient light sensor, wherein the cover defines a shortwave edge of the sensitivity of the sensor, and
   a filter that defines the longwave edge of the sensitivity distribution such that the sensitivity distribution of the ambient light sensor simulates a sensitivity distribution of a human eye.

2. The optoelectronic device according to claim 1, wherein the connection carrier is arranged on a side of the frame facing away from the cover.

3. The optoelectronic device according to claim 1, further comprising contact areas for the external electrical contact-making on a side facing away from the radiation passage area, and the contact areas electrically connect to the optoelectronic component via plated-through holes through the connection carrier.

4. The optoelectronic device according to claim 1, wherein the cover is a film containing a polyimide.

5. The optoelectronic device according to claim 1, wherein the frame, the connection carrier and the cover terminate flush at least along one direction.

6. The optoelectronic device according to claim 1, wherein the cavity has an undercut region in a direction running from the cover to the optoelectronic component.

7. The optoelectronic device according to claim 1, wherein the cavity has a region that tapers at least regionally from the cover in a direction of the optoelectronic component.

8. The optoelectronic device according claim 1, further comprising a further optoelectronic component, which together with the optoelectronic component forms an emitter-detector pair.

9. The optoelectronic device according to claim 8, wherein the further optoelectronic component is arranged in a further cavity and the further cavity is spaced apart from the cavity.

10. The optoelectronic device according to claim 1, which is a proximity sensor and an ambient light sensor.

11. The optoelectronic device according to claim 1, further comprising a further optoelectronic component, wherein the further optoelectronic component is the ambient light sensor.

12. The optoelectronic device according to claim 1, wherein the plated through hole is a cutout whose side areas are provided with an electrically conductive contact coating, said contact coating electrically connected to contact areas formed on a rear side of the connection carrier facing away from the optoelectronic component.

13. The optoelectronic device according to claim 1, wherein the covering is a film that withstands temperature loads of at least 250° C.

14. The optoelectronic device according to claim 1, wherein the ambient light sensor is an integrated circuit having a photosensitive region.

15. A method of producing a plurality of optoelectronic devices comprising:
   a) providing a connection carrier assemblage;
   b) arranging optoelectronic components on the connection carrier assemblage;
   c) positioning a frame element having a plurality of cavities on the connection carrier assemblage such that the optoelectronic components are respectively arranged in a cavity;
   d) arranging a cover on the frame element; and
   e) severing the connection carrier assemblage into a plurality of connection carriers on each of which at least one optoelectronic component and a frame having a cavity is arranged, wherein each connection carrier is a circuit board and comprises a plated through hole that is an opening for air exchange between the cavities and the surrounding environment, wherein the optoelectronic devices comprise an ambient light sensor, and a filter that defines the longwave edge of the sensitivity distribution such that the sensitivity distribution of the ambient light sensor simulates a sensitivity distribution of a human eye, and the cover defines a shortwave edge of the sensitivity of the ambient light sensor.

16. The method according to claim 15, wherein the cover, the frame element and the connection carrier assemblage are severed in e).

* * * * *